United States Patent
Frede

(10) Patent No.: US 10,845,389 B2
(45) Date of Patent: Nov. 24, 2020

(54) MEASUREMENT DEVICE AND METHOD FOR VISUALIZATION OF MULTIPLE CHANNELS

(71) Applicant: Rohde & Schwarz GmbH & Co. KG, Munich (DE)

(72) Inventor: Tobias Frede, Grobenzell (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 332 days.

(21) Appl. No.: 15/911,468

(22) Filed: Mar. 5, 2018

(65) Prior Publication Data
US 2019/0271723 A1    Sep. 5, 2019

(51) Int. Cl.
*G01R 13/02*    (2006.01)

(52) U.S. Cl.
CPC ..... *G01R 13/0236* (2013.01); *G01R 13/0254* (2013.01); *G01R 13/0272* (2013.01)

(58) Field of Classification Search
CPC ............ G01R 13/0236; G01R 13/0254; G01R 13/0272
See application file for complete search history.

(56) References Cited

U.S. PATENT DOCUMENTS

| | | | | |
|---|---|---|---|---|
| 5,371,842 A * | 12/1994 | Easton | ............... | G01R 13/0227 345/440 |
| 2008/0192071 A1* | 8/2008 | Herring | ............... | G01R 13/029 345/642 |
| 2010/0199202 A1* | 8/2010 | Becker | ............... | G06F 3/0481 715/771 |
| 2013/0231882 A1* | 9/2013 | Yu | ............... | G01R 13/029 702/67 |

FOREIGN PATENT DOCUMENTS

| | | |
|---|---|---|
| CA | 1151329 | 8/1983 |
| EP | 2574936 A2 | 4/2013 |
| NL | 8004331 | 7/1980 |

* cited by examiner

*Primary Examiner* — Manuel L Barbee
(74) *Attorney, Agent, or Firm* — Potomac Technology Law, LLC

(57) ABSTRACT

A measurement device, which provides for a visualization of multiple measurement channels, is provided. The measuring device includes n measurement channels configured to receive up to n signals, wherein n is an unsigned integer. The measuring device further includes a processor configured to activate or deactivate each of the n measurement channels, wherein n−k measurement channels are activated, wherein k is an unsigned integer, k≤n and k represents the number of deactivated measurement channels. The measuring device further includes a display. The processor is configured to control the display to display n−k−j traces of the n signals, wherein j is an unsigned integer, j≤k and j represents a number of measurement channels that are not displayed.

14 Claims, 4 Drawing Sheets

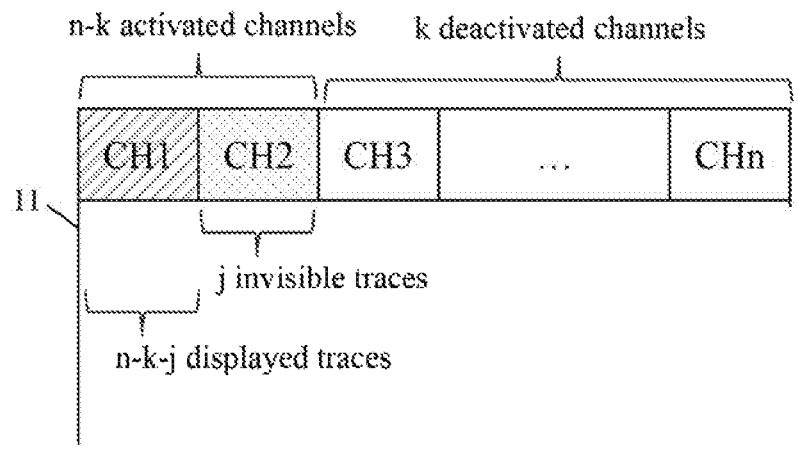
Fig. 4
| | n-k | k | j ≤ k |
|---|---|---|---|
| 2-channel oscilloscope | 1 | 1 | 1 |
| 4-channel oscilloscope | 2 | 2 | [1;2] |
Fig. 5
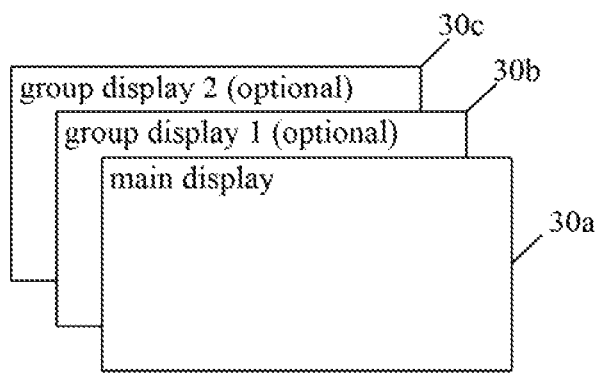
Fig. 6

MEASUREMENT DEVICE AND METHOD FOR VISUALIZATION OF MULTIPLE CHANNELS

TECHNICAL FIELD

The invention relates to a measurement device and a measurement method for providing a visualization of multiple measurement channels.

BACKGROUND

Generally, in times of an increasing number of applications comprising electrical circuitry typically providing multitude of signals, there is a growing need of a measurement device providing a visualization of multiple measurement channels and a corresponding measurement method, especially in order to verify the proper functioning of said applications and to visualize the respective results in an efficient and time-saving manner.

The document EP2574936A2 relates in general to signal acquisition instruments and, more specifically, to a signal acquisition display architecture adapted for using with a digital storage oscilloscope having multiple input channels or other signal acquisition and display devices. In this context, however, no solution is provided with respect to visualizing measurement results in an efficient and time-saving manner.

Accordingly, there is a need for a measurement device and a measurement method providing for a visualization of multiple measurement channels in an efficient and time-saving manner.

SOME EXAMPLE EMBODIMENTS

Embodiments of the present invention advantageously address the foregoing requirements and needs, as well as others, by providing a measurement device and a measurement method providing for a visualization of multiple measurement channels in an efficient and time-saving manner.

According to a first aspect of the invention, a measurement device, which provides for a visualization of multiple measurement channels, is provided. The measurement device comprises n measurement channels configured to acquire up to n signals, wherein n is an unsigned integer, and each of the n measurement channels is activated or deactivated, wherein n–k measurement channels are activated, wherein k is an unsigned integer, k≤n and k represents the number of deactivated measurement channels. The measurement device further comprises a display configured to display n–k–j traces of the n signals, wherein j is an unsigned integer, j≤k and j represents a number of measurement channels that are not displayed. Advantageously, the measurement channels can be visualized in an efficient and time-saving manner.

According to a first implementation form of the measuring device, at least one of the n measurement channels comprises at least one of an analog-to-digital converter, a trigger unit, an acquisition memory, and a post-processing unit. Advantageously, accuracy of measurements can be ensured.

According to a further implementation form of the measuring device, the measurement device further comprises a processing unit configured to determine at least one measurement parameter of at least one of the j measurement channels. Advantageously, the measurement parameter can be displayed, for example, without displaying the respective trace in order to further increase efficiency of visualization.

According to a further implementation form of the measuring device, the at least one measurement parameters comprises frequency, amplitude, mean, minimum, maximum, or any combination thereof. Advantageously, a multitude of characteristics of the measurement signals can be investigated.

According to a further implementation form of the measuring device, at least one of the n measurement channels is a channel being configured to derive at least one value or a trace from at least one other measurement channel or from any combination of the remaining measurement channels. Advantageously, with respect to the measurement signals, various operations and correlations can be visualized.

According to a further implementation form of the measuring device, the measurement device is configured to form grouped channels out of the n measurement channels, for example, to form at least one group out of at least two of the n measurement channels. Advantageously, efficiency of visualization can further be increased.

According to a further implementation form of the measuring device, the measurement device is further configured to set the at least one group to background or to foreground. Advantageously, unneeded groups with respect to the current measurement can be made invisible.

According to a further implementation form of the measuring device, the display is further configured to display at least one of the groups set to foreground. Advantageously, groups being needed for the current measurement can be set to visibility.

According to a further implementation form of the measuring device, the measurement device is further configured to set a channel parameter only once for grouped channels, for example, to set a channel parameter only once for the at least one group. Advantageously, time can be saved during measurement.

According to a second aspect of the invention, a measurement method, which provides for a visualization of multiple measurement channels, is provided. The measurement method comprises the step of acquiring up to n signals with the aid of n measurement channels, wherein n is an unsigned integer, and each of the n measurement channels is activated or deactivated, wherein n–k measurement channels are activated, wherein k is an unsigned integer, k≤n and k represents the number of deactivated measurement channels. The measurement method further comprises the step of displaying n–k–j traces of the n signals, wherein j is an unsigned integer, j≤k and j represents a number of measurement channels that are not displayed. Advantageously, the measurement channels can be visualized in an efficient and time-saving manner.

According to a first implementation form of the measurement method, at least one of the n measurement channels comprises at least one of an analog-to-digital converter, a trigger unit, an acquisition memory, and a post-processing unit. Advantageously, accuracy of measurements can be ensured.

According to a further implementation form of the measurement method, the measurement method further comprises the step of determining at least one measurement parameter of at least one of the j measurement channels. Advantageously, the measurement parameter can be displayed, for example, without displaying the respective trace in order to further increase efficiency of visualization.

According to a further implementation form of the measurement method, the at least one measurement parameter comprises frequency, amplitude, mean, minimum, maximum, or any combination thereof. Advantageously, a multitude of characteristics of the measurement signals can be investigated.

According to a further implementation form of the measurement method, the measurement method further comprises the step of configuring at least one of the n measurement channels to derive at least one value or a trace from at least one other measurement channel or from any combination of the remaining measurement channels. Advantageously, with respect to the measurement signals, various operations and correlations can be visualized.

According to a further implementation form of the measurement method, the measurement method further comprises the step of forming grouped channels out of the n measurement channels, for example, forming at least one group out of at least two of the n measurement channels. Advantageously, efficiency of visualization can further be increased.

According to a further implementation form of the second aspect, the measurement method further comprises the step of setting the at least one group to the background or to the foreground. Advantageously, unneeded groups with respect to the current measurement can be made invisible.

According to a further implementation form of the measurement method, the measurement method further comprises the step of displaying at least one of the groups set to the foreground. Advantageously, groups being needed for the current measurement can be set to visibility.

According to a further implementation form of the measurement method, the measurement method further comprises the step of setting a channel parameter only once for grouped channels, for example, setting a channel parameter only once for the at least one group. Advantageously, time can be saved during measurement.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Embodiments of the present invention are illustrated by way of example, and not by way of limitation, in the figures of the accompanying drawings, in which like reference numerals refer to similar elements, and in which:

FIG. 4 shows a second example of a display of the measuring device of FIG. 1, in accordance with example embodiments of the present invention;

FIG. 5 shows a table of example values for parameters of the measuring device of FIG. 1, in accordance with example embodiments of the present invention;

FIG. 6 shows an example of different group displays of a measuring device, in accordance with example embodiments of the present invention.

DETAILED DESCRIPTION

A measurement device and a measurement method providing for a visualization of multiple measurement channels in an efficient and time-saving manner are described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

A processor, unit, module or component (as referred to herein) may be composed of software component(s), which are stored in a memory or other computer-readable storage medium, and executed by one or more processors or CPUs of the respective devices. A module or unit may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in a computer memory store.

Figure 1:
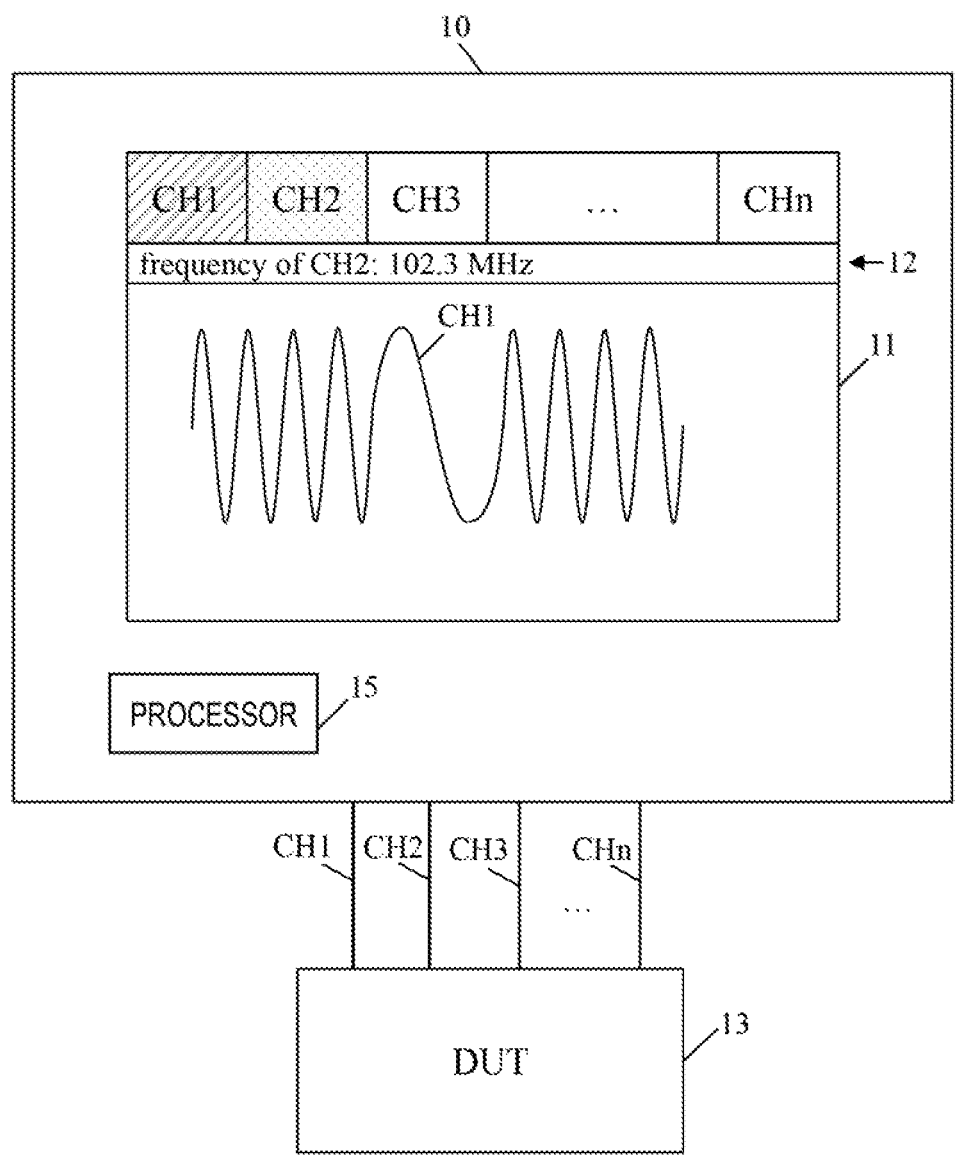
FIG. 1 shows an example measuring device that provides for a visualization of multiple measurement channels, in accordance with example embodiments of the present invention.

FIG. 1 shows an example measuring device 10 that provides for a visualization of multiple measurement channels, in accordance with example embodiments of the present invention. The measurement device 10 comprises the n measurement channels CH1, CH2, CH3, . . . , CHn configured to acquire up to n signals from a device under test 13. In this context, n is an unsigned integer and each of the n measurement channels CH1-CHn is activated or deactivated, wherein n−k measurement channels are activated, wherein k is an unsigned integer and k≤n, and k represents the number of deactivated measurement channels. Additionally, the measurement device 10 further comprises a display 11 configured to display n−k−j traces of the n signals, wherein j is an unsigned integer and j≤k, and j represents the number of measurement channels that are not displayed. The measuring device 10 may further comprise a processor 15, which may be configured to control the display and other functions of the measuring device.

In this example, n−k=2 channels, namely channels CH1 and CH2, are activated, whereas k channels are deactivated, and n−k−j=1 channel, namely channel CH1, is displayed on the display 11. Further, j=1 channel, namely channel CH2, is activated but not displayed. In other words, while the channel CH2 is set to not be displayed, the channel is processed in the background. In this context, it is particularly advantageous that at least one parameter, such as the frequency, of the corresponding signal of the non-displayed channel CH2 is displayed in a certain area 12 of the display 11.

Figure 2:
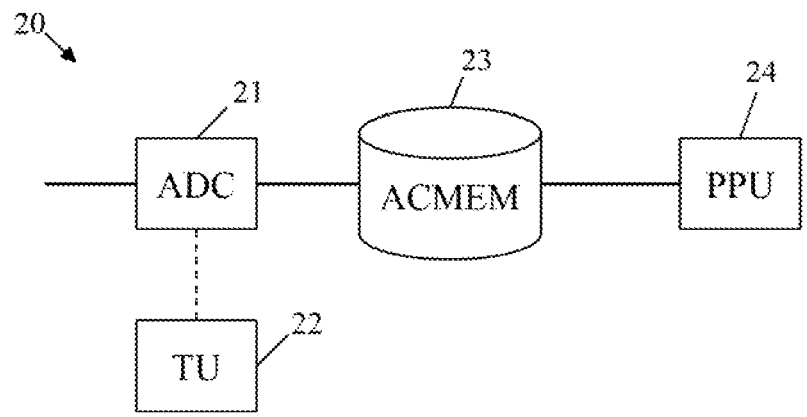
FIG. 2 shows an example of a measurement channel, in accordance with example embodiments of the present invention.

FIG. 2 shows an example measurement channel 20, of one of the measurement channels CH1-CHn, in accordance with example embodiments of the present invention. The measurement channel 20 comprises an analog-to-digital converter 21, a trigger unit 22, an acquisition memory 23, and a post-processing unit 24.

Further, an incoming measurement signal is digitized with the aid of the analog-to-digital converter. In this context, with respect to the measurement signal, it may be triggered according to a trigger condition set by the trigger unit 22. Further, the digitized measurement signal is stored (e.g., buffered) via the acquisition memory 23. The stored signal may thus be post-processed with the aid of the post-processing unit 24.

Figure 3:
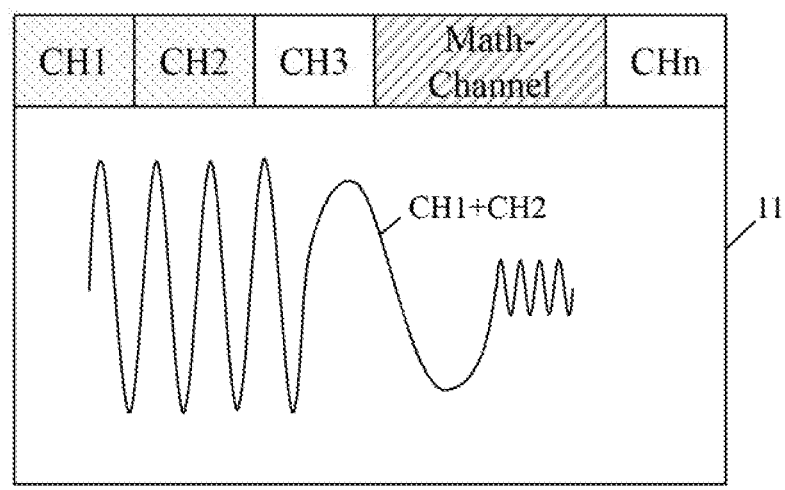
FIG. 3 shows a first example of a display of the measuring device of FIG. 1, in accordance with example embodiments of the present invention.

FIG. 3 shows a first example of a display 11 of the measuring device 10 of FIG. 1, in accordance with example embodiments of the present invention. In this example, n−k=3 channels, namely channels CH1, CH2, and a Math-Channel, for example, comprising the sum of the traces of channels CH1 and CH2, are activated, whereas k channels are deactivated, and n−k−j=1 channel, namely the Math-Channel, is displayed on the display 11. Further, j=2 channels, namely channels CH1 and CH2, are activated but not displayed.

FIG. 4 shows a second example of a display 11 of the measuring device 10 of FIG. 1, in accordance with example embodiments of the present invention. FIG. 4 shows a general case of n−k activated channels, k deactivated channel, j traces or channels being active (e.g., in the background), but not displayed, and n−k−j traces or channels being active and displayed.

Further, with respect to a 2-channel-oscilloscope and a 4-channel-oscilloscope, for example, FIG. 5 shows a table of possible values for n−k, k, and j.

FIG. 6 shows an example of different group displays 30a, 30b, 30c, resulting from grouping channels together, of a measuring device, in accordance with example embodiments of the present invention. In this context, the measurement device 10 may be configured to form grouped channels out of the n measurement channels, for example, to form at least one group out of at least two of the n measurement channels.

Additionally, the measurement device 10 may further be configured to set the at least one group to the background or to the foreground of the display. With reference to FIG. 6, the main group 30a is set to the foreground, whereas there are two optional groups 30b, 30c set to the background.

Further, the display 11 of the measurement device 10 may be configured to display at least one of the groups set to the foreground, such as the main group 30a.

In this context, the measurement device 10 may advantageously be further configured to set a channel parameter only once for grouped channels, such as for the main group 30a.

Figure 7:
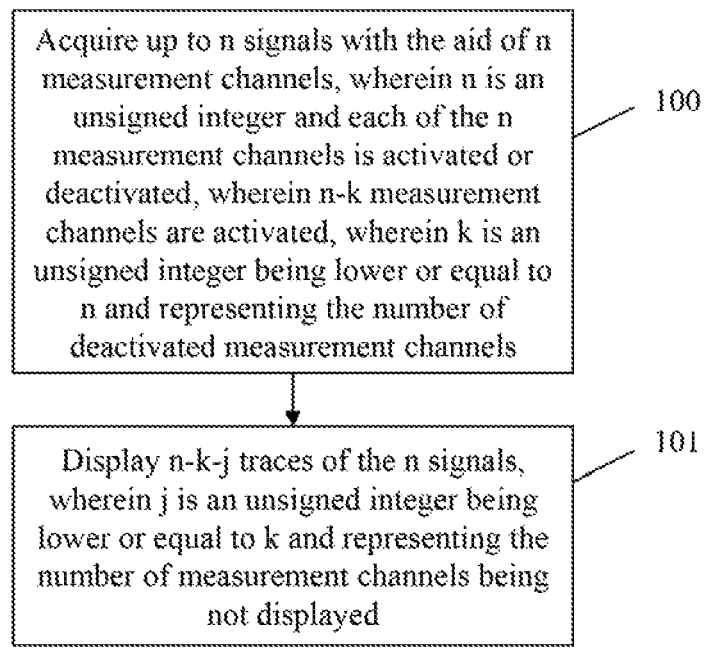
FIG. 7 shows a flow chart of an example measurement method that provides for a visualization of multiple measurement channels, in accordance with example embodiments of the present invention.

FIG. 7 shows a flow chart of an example measurement method that provides for a visualization of multiple measurement channels, in accordance with example embodiments of the present invention. In step 100, up to n signals are acquired with the aid of n measurement channels of a measuring device, wherein n is an unsigned integer and each of then measurement channels CH1-CHn is activated or deactivated, wherein n−k measurement channels are activated, wherein k is an unsigned integer and k≤n, and k represents the number of deactivated measurement channels. In step 101, n−k−j traces of then signals are displayed on a display of the measuring device, wherein j is an unsigned integer and j≤k, and j represents the number of measurement channels that are not displayed.

In this context, at least one of the n measurement channels may comprise at least one of an analog-to-digital converter, a trigger unit, an acquisition memory, and a post-processing unit.

Further, the measurement method may further comprise the step of determining at least one measurement parameter of at least one of the j measurement channels not displayed.

Further, the at least one measurement parameter may comprise frequency, amplitude, mean, minimum, maximum, or any combination thereof.

Additionally, the measurement method may further comprise the step of configuring at least one of the n measurement channels to derive at least one value or a trace from at least one other measurement channel or from any combination of the remaining measurement channels.

Additionally, the measurement method may further comprise the step of forming grouped channels out of the n measurement channels, for example, forming at least one group out of at least two of the n measurement channels.

In this context, the measurement method may further comprise the step of setting the at least one group to the background or to the foreground.

Further, the measurement method may further comprise the step of displaying at least one of the groups set to the foreground.

Additionally, the measurement method may further comprise the step of setting a channel parameter only once for grouped channels, for example, setting a channel parameter only once for the at least one group.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A measurement device, which provides for a visualization of multiple measurement channels, comprising:
   n measurement channels configured to receive up to n signals, wherein n is an unsigned integer;
   a processor configured (i) to activate or deactivate each of the n measurement channels, wherein n−k measurement channels are activated and k measurement channels are deactivated, wherein k is an unsigned integer and k≤n, (ii) to form at least one grouped channel out of the n measurement channels, and (iii) to set one or more channel parameters only once for at least one of the grouped channels; and
   a display; and
   wherein the processor is configured to control the display to display n−k−j traces of the n signals, wherein j is an unsigned integer, j≤k and j represents a number of measurement channels that are not displayed, and
   wherein the processor is configured to control the display to display at least one measurement parameter of a corresponding signal of at least one of the j measurement channels in a certain area of the display.

2. The measurement device according to claim 1, wherein at least one of the n measurement channels comprises at least one of an analog-to-digital converter, a trigger unit, an acquisition memory, and a post-processing unit.

3. The measurement device according to claim 1, wherein the processor is further configured to determine at least one measurement parameter of at least one of the j measurement channels.

4. The measurement device according to claim 3, wherein the at least one measurement parameter comprises one or more of a frequency, an amplitude, a mean, a minimum, and a maximum.

5. The measurement device according to claim 1, wherein at least one of the n measurement channels is configured to derive at least one value or trace from at least one other of the n measurement channels or from a combination of the other n measurement channels.

6. The measurement device according to claim 1, wherein the processor is further configured to set the at least one grouped channel to a background view or to a foreground view.

7. The measurement device according to claim 6, wherein the processor is configured to control the display to display at least one of the grouped channels set to the foreground view.

8. A measurement method, which provides for visualization of multiple measurement channels, comprising:
   receiving, by n measurement channels of a measuring device, up to n signals, wherein n is an unsigned integer and each of the n measurement channels is activated or deactivated, wherein n−k measurement channels are activated and k measurement channels are deactivated, wherein k is an unsigned integer and k≤n;
   forming at least one grouped channel out of the n measurement channels;
   setting one or more channel parameters only once for at least one of the grouped channels;
   displaying, by a display of the measuring device, n−k−j traces of the n signals, wherein j is an unsigned integer, j≤k and j represents a number of measurement channels that are not displayed; and
   displaying, by the display of the measuring device, at least one measurement parameter of a corresponding signal of at least one of the j measurement channels in a certain area of the display.

9. The measurement method according to claim 8, wherein at least one of the n measurement channels comprises at least one of an analog-to-digital converter, a trigger unit, an acquisition memory, and a post-processing unit.

10. The measurement method according to claim 8, further comprising:
    determining at least one measurement parameter of at least one of the j measurement channels.

11. The measurement method according to claim 10, wherein the at least one measurement parameter comprises one or more of a frequency, an amplitude, a mean, a minimum, and a maximum.

12. The measurement method according to claim 8, further comprising:
    configuring at least one of the n measurement channels to derive at least one value or trace from at least one other of the n measurement channels or from a combination of the other n measurement channels.

13. The measurement method according to claim 8, further comprising:
    setting the at least one grouped channel to a background view or to a foreground view.

14. The measurement method according to claim 8, further comprising:
    displaying at least one of the grouped channels set to the foreground view.

* * * * *